(12) United States Patent
Witczak et al.

(10) Patent No.: US 12,033,862 B2
(45) Date of Patent: *Jul. 9, 2024

(54) METHOD OF FORMING AN ELECTRICALLY CONDUCTIVE FEATURE TRAVERSING A MICROSCOPIC STEP AND RELATED APPARATUS

(71) Applicant: XTPL S.A., Wrocław (PL)

(72) Inventors: Łukasz Witczak, łódzkie (PL); Jolanta Gadzalińska, łódzkie (PL); Aneta Wiatrowska, dolnośąskie (PL); Karolina Fiączyk, dolnośąskie (PL); Piotr Kowalczewski, łódzkie (PL); Filip Granek, dolnośąlskie (PL)

(73) Assignee: XTPL S.A., Wroclaw (PL)

( * ) Notice: Subject to any disclaimer, the term of this patent is extended or adjusted under 35 U.S.C. 154(b) by 86 days.

This patent is subject to a terminal disclaimer.

(21) Appl. No.: 17/654,088

(22) Filed: Mar. 9, 2022

(65) Prior Publication Data
US 2022/0310397 A1 Sep. 29, 2022

Related U.S. Application Data

(60) Provisional application No. 63/164,960, filed on Mar. 23, 2021.

(51) Int. Cl.
| | |
|---|---|
| *H01L 21/288* | (2006.01) |
| *B41M 1/22* | (2006.01) |
| *B82Y 40/00* | (2011.01) |
| *H01B 1/02* | (2006.01) |

(52) U.S. Cl.
CPC ............. *H01L 21/288* (2013.01); *B41M 1/22* (2013.01); *B82Y 40/00* (2013.01); *H01B 1/02* (2013.01)

(58) Field of Classification Search
None
See application file for complete search history.

(56) References Cited

U.S. PATENT DOCUMENTS 11,673,406 B2 * 6/2023 Granek .................... B41J 3/407
 347/85
2021/0354361 A1 * 11/2021 Kaczmarz ............ C09D 11/037

* cited by examiner

*Primary Examiner* — Joshua D Zimmerman
(74) *Attorney, Agent, or Firm* — K&L Gates LLP

(57) ABSTRACT

A method of forming an electrically conductive feature traversing a microscopic step on or in a substrate is disclosed. A metallic nanoparticle composition is continuously extruded from a capillary tube (nozzle) while displacing the capillary tube along a first portion of a trajectory from a first position (above a step-top portion) past an edge of the microscopic step to a second position to form a first extrudate. The composition is continuously extruded while displacing the nozzle along a sloped second portion of the trajectory from the second position to a third position (above a step-bottom portion) to form a second extrudate. The third position is at a lower height than the second position. The composition is continuously extruded while displacing the nozzle along a third portion of the trajectory from the third position to a fourth position (above the step-bottom portion). The feature includes the first, second, and third extrudates.

20 Claims, 12 Drawing Sheets

METHOD OF FORMING AN ELECTRICALLY CONDUCTIVE FEATURE TRAVERSING A MICROSCOPIC STEP AND RELATED APPARATUS

CROSS-REFERENCE TO RELATED APPLICATION

This application claims the benefit of and priority under 35 U.S.C. § 119(e) to U.S. Provisional Application No. 63/164,960, titled METHOD OF FORMING AN ELECTRICALLY CONDUCTIVE FEATURE TRAVERSING A MICROSCOPIC STEP AND RELATED APPARATUS, filed Mar. 23, 2021, the disclosure of which is hereby incorporated by reference in its entirety.

BACKGROUND

Recent progress in metallic nanoparticle compositions and printing apparatuses have enabled dispensing metallic nanoparticle compositions on substrates to form metallic nanoparticle lines having line widths in a range of about 2 µm to 20 µm. Metallic nanoparticles such as silver nanoparticles and copper nanoparticles can be used in these compositions. A problem to be solved is how to form an electrically conductive feature traversing a microscopic step on or in a substrate, by printing (additive deposition) of metallic nanoparticle compositions.

SUMMARY

In one aspect, a method of forming an electrically conductive feature traversing a microscopic step on or in a substrate is disclosed. The method includes the following steps: (A) continuously extruding a metallic nanoparticle composition from a capillary tube while displacing the capillary tube relative to the substrate along a first portion of a trajectory from a first position past an edge of the microscopic step to a second position to form a first extrudate; (B) continuously extruding the metallic nanoparticle composition from the capillary tube while displacing the capillary tube relative to the substrate along a second portion of the trajectory from the second position to a third position to form a second extrudate; and (C) continuously extruding the metallic nanoparticle composition from the capillary tube while displacing the capillary tube relative to the substrate along a third portion of the trajectory from the third position to a fourth position to form a third extrudate. The electrically conductive feature includes the first, second, and third extrudates. Each of the extrudates is continuous, the second extrudate is connected to the first extrudate, and the third extrudate is connected to the second extrudate. In step (A), the first position is above a step top portion, the displacing is predominantly lateral, and the first extrudate overlies and contacts the step top portion. In step (B), the second portion of the trajectory is sloped and the third position is above a step bottom portion and is at a lower height than the second position. In step (C), the fourth position is above the step bottom portion, the displacing is predominantly lateral, and the third extrudate overlies and contacts the step bottom portion.

In another aspect, an apparatus for forming an electrically conductive feature traversing a microscopic step on or in a substrate is disclosed. The apparatus includes: a substrate stage which supports the substrate, a print head, a regulated pneumatic system, a print head positioning system configured to vertically position and laterally position the print head relative to the substrate, and a controller electronically coupled to the print head positioning system and to the regulated pneumatic system. The print head includes (1) a piston-cylinder assembly including a cylinder, a pneumatic port at a first end of the cylinder, an outlet port at a second end of the cylinder opposite the first end, and a piston movable in the cylinder between the first end and the second end and (2) a capillary tube including a tube inlet and a tube outlet. The pneumatic port is pneumatically coupled to the regulated pneumatic system. The tube inlet is coupled to the outlet port of the piston-cylinder assembly. The controller is configured to concurrently control the print head positioning system and the regulated pneumatic system such that a metallic nanoparticle composition is extruded by the piston through the capillary tube under a pressure applied by the regulated pneumatic system. The pressure is varied in accordance with a surface roughness of a respective portion of the substrate underlying the capillary tube.

The above summary is not intended to describe aspect of the present disclosure. The description that follows more particularly exemplifies various illustrative aspects. In several places throughout the disclosure, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various aspects of the disclosure in connection with the accompanying drawings, in which.

Corresponding reference characters indicate corresponding parts throughout the several views. The exemplifications set out herein illustrate various disclosed embodiments, in one form, and such exemplifications are not to be construed as limiting the scope thereof in any manner.

DETAILED DESCRIPTION

The present disclosure relates to a method of forming an electrically conductive feature traversing a microscopic step on or in a substrate and an apparatus for forming an electrically conductive feature traversing a microscopic step on or in a substrate.

In this disclosure:

The words "preferred" and "preferably" refer to aspects of the disclosure that may afford certain benefits, under certain circumstances. However, other aspects may also be preferred, under the same or other circumstances. Furthermore, the recitation of one or more preferred aspects does not imply that other aspects are not useful and is not intended to exclude other aspects from the scope of the disclosure.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
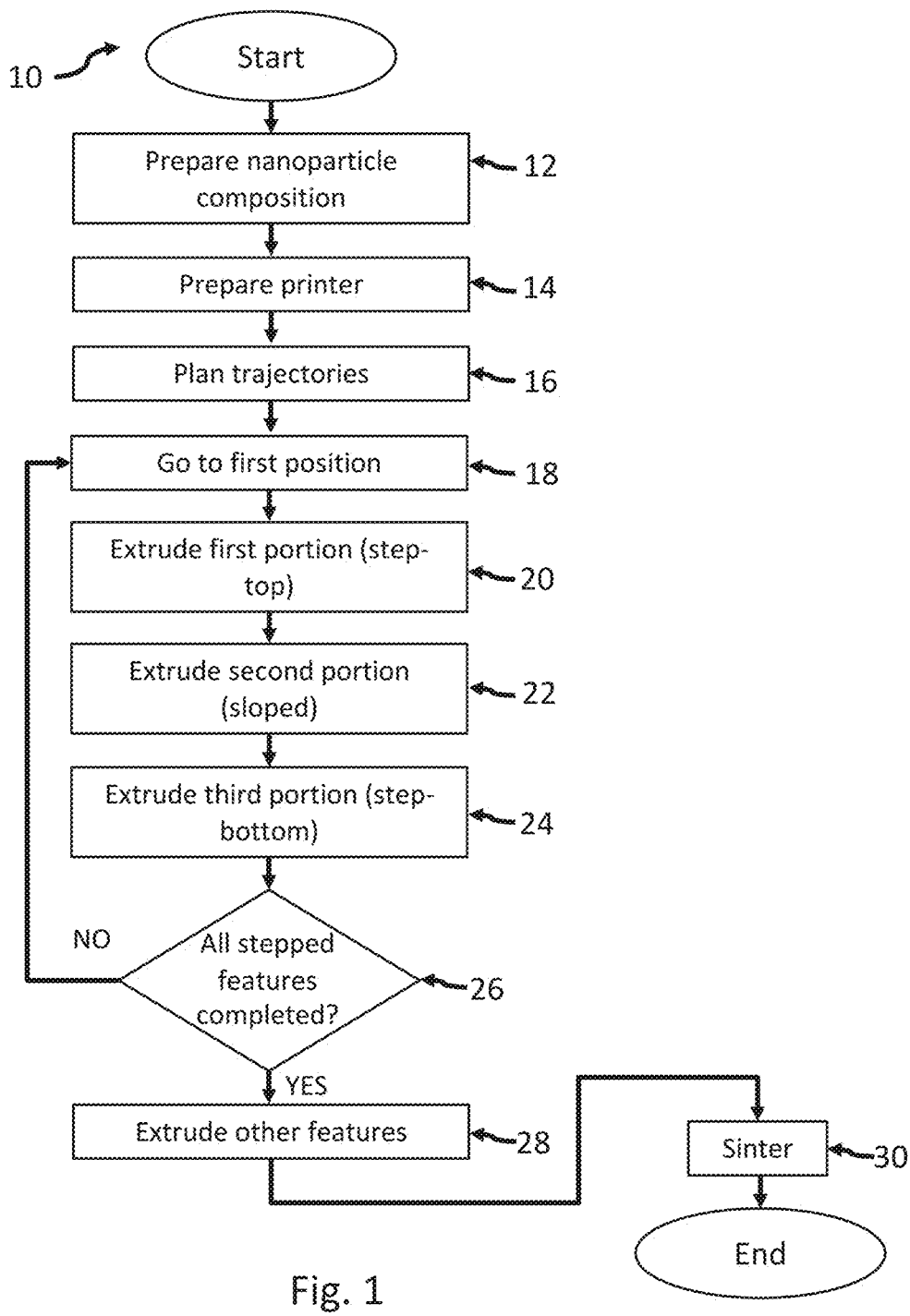
FIG. 1 is a flow diagram of a method of forming an electrically conductive feature, according to one aspect of this disclosure.

FIG. 1 is a flow diagram of a method 10 of forming an elongate electrical connection feature (sometimes referred to as an electrically conductive feature or a conductive feature) traversing a microscopic step on or in a substrate. For example, suppose that there is a solid-state light-emitting element (e.g., light-emitting diode (LED) or laser diode) on a substrate, with an electrode located on its top surface. The conductive feature can traverse a microscopic step between the electrode of the solid-state light-emitting element and a conductive trace on a substrate. In other cases, there may be a microscopic step in the substrate, between a surface of the substrate and a recess in the substrate. In the present disclosure, metallic nanoparticles are used to form the conductive features. Among various metallic nanoparticles, silver nanoparticles and copper nanoparticles may be important because of the high electrical conductivity of silver and copper. For example, silver nanoparticles having an average particle size in a range of 20 nm to 80 nm, and copper nanoparticles having an average particle size in a range of 60 nm to 160 nm have been considered.

The method 10 includes steps 12, 14, 16, 18, 20, 22, 24, 26, 28, and 30. At step 12, a metallic nanoparticle composition is prepared. This includes synthesizing metallic nanoparticles unless metallic nanoparticles are already available. Generally, the synthesis of metallic nanoparticles in solution employs three components: (1) metal precursors (e.g., AgNO3 for silver nanoparticles and Cu(NO3)2 for copper nanoparticles); (2) reducing agents (e.g., ethylene glycol for silver nanoparticles and sodium hypophosphite for copper nanoparticles); and (3) stabilizing (capping) agents (e.g., polyvinylpyrrolidone). Polyvinylpyrrolidone, abbreviated as PVP, is soluble in water and other polar solvents. When PVP is effectively used as a dispersant, stable colloidal silver nanoparticles or copper nanoparticles covered (capped) with PVP polymer can be obtained in small size (<250 nm) because the PVP reduces the aggregation of the silver or copper nanoparticles.

The average size of the silver nanoparticles can be controlled to within a range of 20 nm to 80 nm. The average size of the copper nanoparticles can be controlled to within a range of 60 nm to 160 nm. The average particle size and dispersity can be controlled by controlling thermodynamic and kinetic reaction parameters. Reaction temperature, temperature ramp, and reaction time can be the important thermodynamic reaction parameters. The rate of adding reagents and molar ratio of used metal precursor to stabilizing agent (PVP) can be the important kinetic reaction parameters. An appropriate combination of these parameters leads to obtaining nanoparticles that exhibit the desired properties of small particles size, low dispersity, and high dispersion stability (low occurrence of aggregation).

Furthermore, at step 12, a metallic nanoparticle composition is made from the metallic nanoparticles. Generally, the nanoparticles are separated, to remove impurities and excess PVP, and dispersed in a solvent mixture including a first solvent and an optional second solvent. The metallic nanoparticle composition may optionally include additives to better control its physicochemical properties. These additives include surfactants, binders, adhesion promoters, and antifoaming agents. In some aspects, the concentration of such additives should not exceed 3% by weight in the metallic nanoparticle composition.

The preparation of an example composition is described in detail in the Example 1 hereinbelow. The Example 1 composition includes silver nanoparticles and triethylene glycol as a solvent. It has been found that solvents having a boiling point of at least 280° C. at a pressure of 760 mm Hg are preferable. In particular, triethylene glycol, which has a boiling point of 288° C. at a pressure of 760 mm Hg is preferable. On the other hand, it is preferable to reduce or avoid the use of lower-boiling point solvents having a boiling point of less than 280° C. at a pressure of 760 mm Hg. Examples of such lower-boiling point solvents are water, methanol, and ethanol. In a preferred metallic nanoparticle composition, a concentration, in aggregate, of solvents having a boiling point of less than 280° C. at a pressure of 760 mm Hg in the metallic nanoparticle composition does not exceed 3 wt %. In a preferred metallic nanoparticle composition, a concentration of solids (metallic nanoparticles including PVP capping layer) in the metallic nanoparticle composition is 75 wt % or greater, or 80 wt % or greater. In the Example 1 composition, the concentration of silver nanoparticles solids is approximately 85 wt %.

Figure 2:
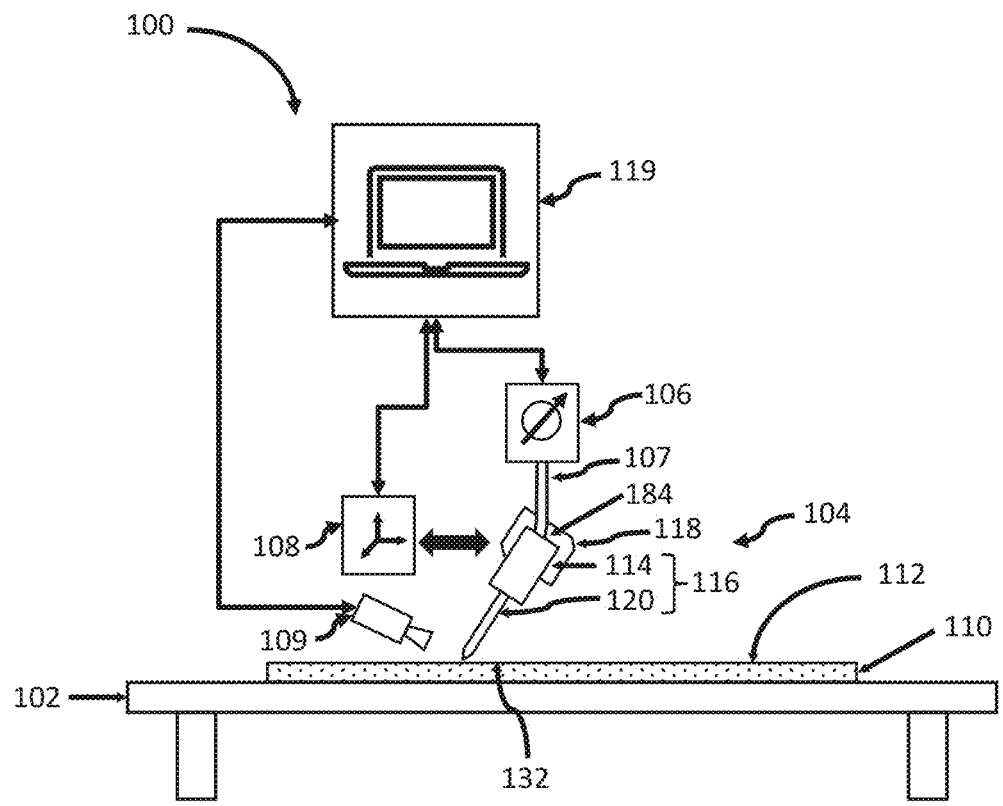
FIG. 2 is a block diagram view of an illustrative nanoparticle composition printing apparatus, according to one aspect of this disclosure.

At step 14, a printing apparatus (printer) is prepared for use. FIG. 2 is a block diagram view of an illustrative printing apparatus. The printing apparatus 100 includes a substrate stage 102, a print head 104, a regulated pneumatic system 106, a print head positioning system 108, and a controller 119. The printing apparatus 100 can also include an imaging system 109. The substrate stage 102 supports a substrate 110. The substrate 110 is fixed in position on the substrate stage 102 during the printing (dispensing) and has a printable surface 112, which is facing upward and facing towards the print head 104. The print head 104 is positioned above the substrate 110. The print head 104 includes a metallic nanoparticle composition dispenser 116 and a cartridge holder (dispenser holder) 118. The metallic nanoparticle composition dispenser 116 includes a piston-cylinder assembly 114 and a capillary tube (nozzle) 120, as described with reference to FIG. 9. Typically, the regulated pneumatic system 106 includes a pump and a pressure regulator. In the example shown in FIG. 2, a pneumatic port 184 of the piston cylinder assembly 114 is coupled to the regulated pneumatic system 106 via tubing 107. Preferably, the regulated pneumatic system 106 is capable of applying pressure in a range of 0 to 9 bar to the pneumatic port 184.

Figure 8:
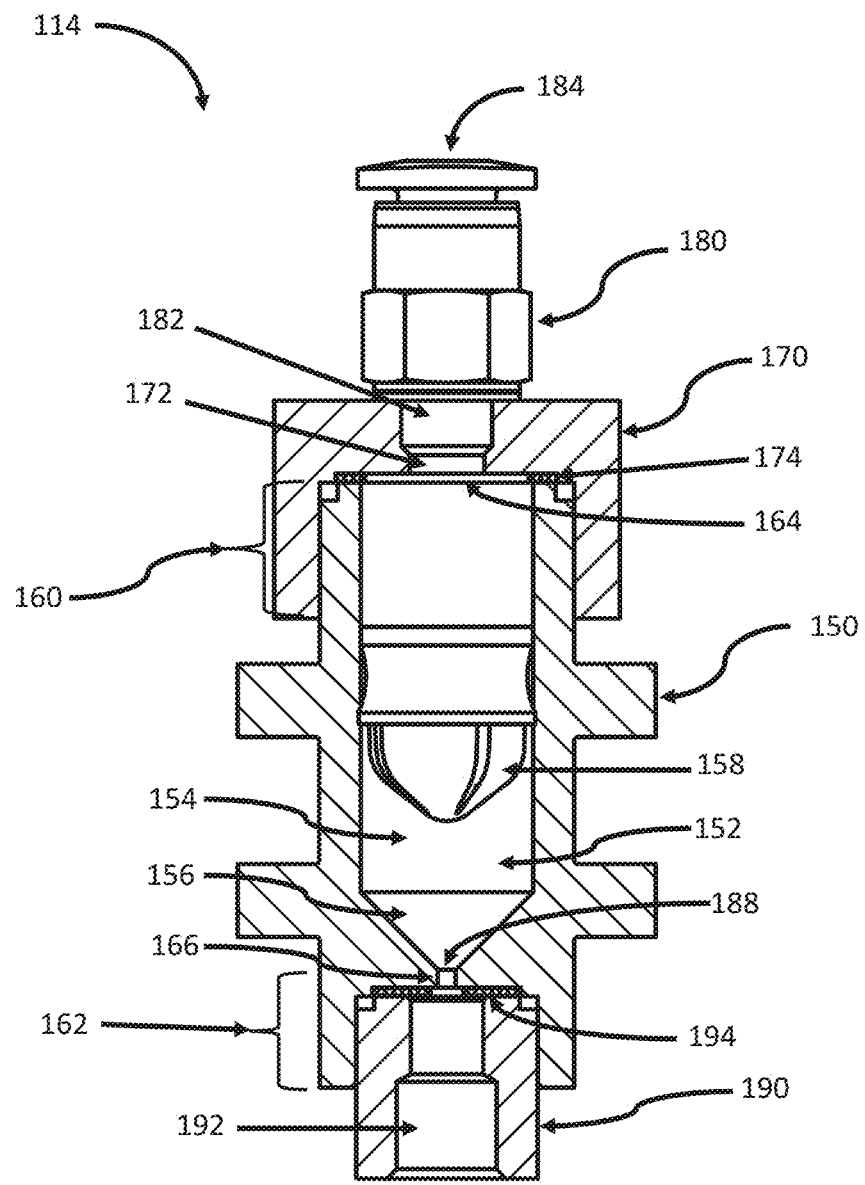
FIG. 8 is a schematic side view and partial cross-sectional view of a piston-cylinder assembly, according to one aspect of this disclosure.

At step 14, a piston-cylinder assembly is configured. More generally, the piston-cylinder assembly is sometimes referred to as a printer cartridge. A schematic side view and partial cross-sectional view of an exemplary piston-cylinder assembly 114 is shown in FIG. 8. In the example shown, the piston-cylinder assembly 114 includes a cylinder 150, a cylinder cover 170, a pneumatic connector 180, and an intermediate sealing sleeve 190. The cylinder 150 is shown in cross-section to show a cylindrical cavity portion 154 and a conical cavity portion 156. A piston 158 is located inside cylinder 150. The cylinder 150 has a first end (top end) portion 160 and a second end (bottom end) portion 162 opposite the first end. The cylinder cover 170 is sealably mated to the cylinder 150 at the first end portion 160. In the example shown, an interior surface of the cylinder cover 170 and an exterior surface of the cylinder 150 at its first end portion 160 form a threaded joint. A flat gasket 174 is under compression between the cylinder cover 170 and the cylinder 150 and forms a seal. The intermediate sealing sleeve 190 is sealably mated to the cylinder 150 at the second end portion 162. In the example shown, an exterior surface of the intermediate sealing sleeve 190 and an interior surface of the cylinder 150 at its second end portion 162 form a threaded joint. A flat gasket 194 is under compression between the intermediate sealing sleeve 190 and the cylinder 150 and forms a seal.

The cylinder cover 170 has an opening 172, which retains the pneumatic connector 180. A pneumatic port 184 extends longitudinally through the pneumatic connector 180. The cylinder 150 has a first end 164, in the first end portion 160, and a second end 166, in the second end portion 162. Accordingly, the pneumatic port is at the first end of the cylinder. Air or fluid enters the cylinder from the pneumatic port 184. Inside the cylinder, air or fluid first travels through the cylindrical cavity portion 154 and then a conical cavity portion 156, which tapers to an outlet port 188 at its apex. The outlet port 188 is at the second end 166 opposite the first end 164. The piston 158 is movable in the cylinder 150 between the first end 164 and the second end 166.

Figure 3:
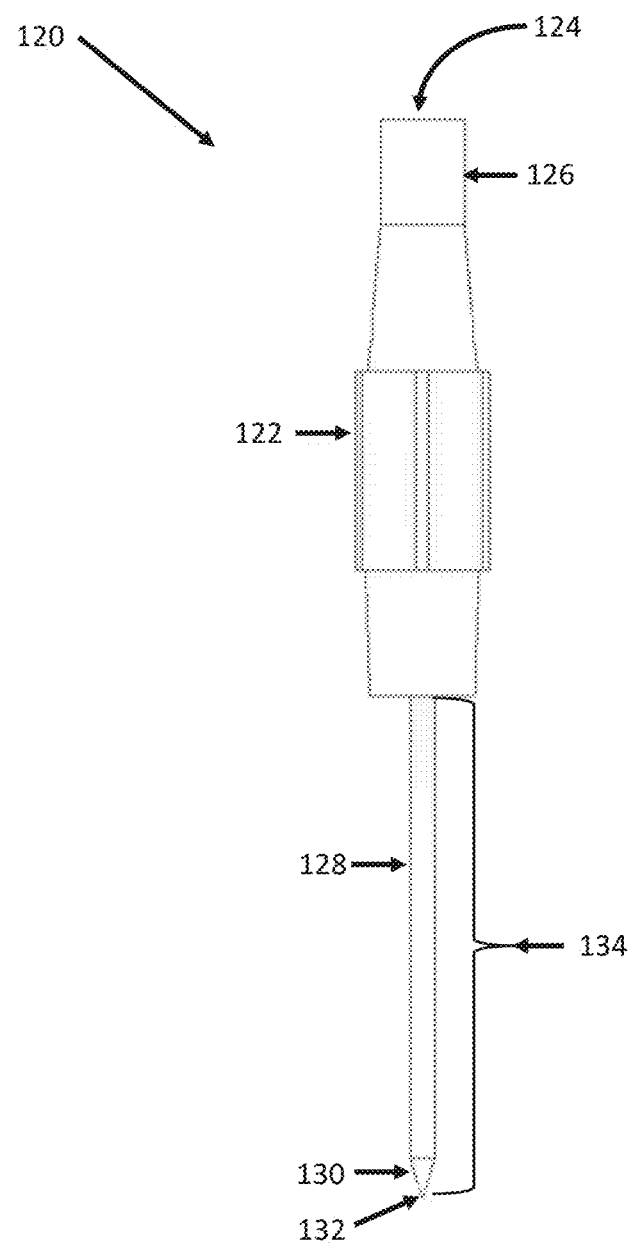
FIG. 3 is a schematic side view of a glass capillary tube, according to one aspect of this disclosure.
Figure 9:
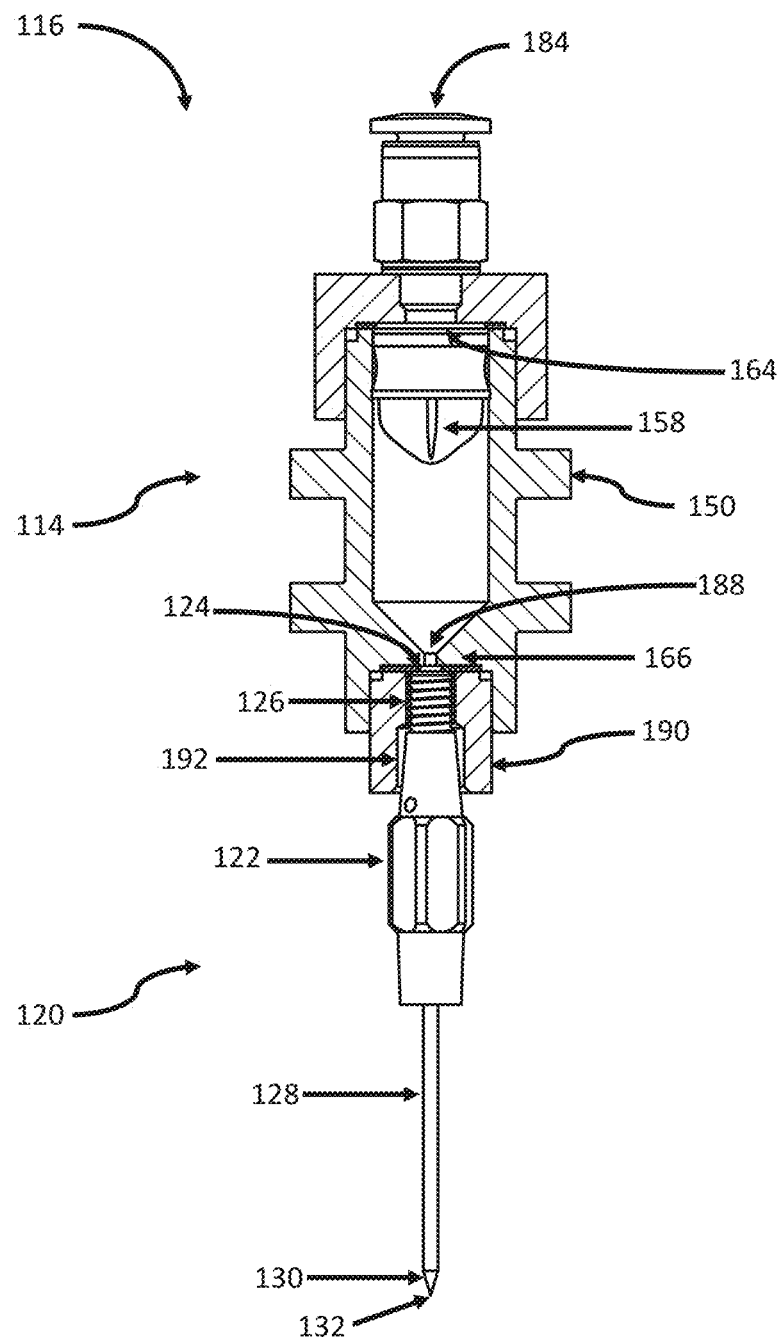
FIG. 9 is a schematic side view and partial cross-sectional view of a metallic nanoparticle composition dispenser, according to one aspect of this disclosure.

FIG. 9 is a schematic side view and partial cross-sectional view of a dispenser 116. The dispenser 116 includes a piston-cylinder assembly 114 (FIG. 8) and a capillary tube (nozzle) 120. Capillary tube 120 has a tube inlet 124 and a tube outlet 132. Capillary tube 120 is described in greater detail with reference to FIG. 3. In the example shown, there is a handle 122, including a threaded portion 126, attached to the capillary tube. The threaded portion 126 and an interior surface 192 of the intermediate sealing sleeve 190 form a threaded joint. Accordingly, the intermediate sealing sleeve retains the handle that is attached to the capillary tube. The tube inlet 124 of capillary tube 120 is coupled to the outlet port 188 at the second end 166 of the cylinder 150. At step 14, a capillary tube is installed in the piston-cylinder assembly, to form a dispenser. The dispenser is particularly suited to dispense metallic nanoparticle compositions described herein. Accordingly, the dispenser is sometimes referred to as a metallic nanoparticle composition dispenser.

Commercially available glass capillary tubes can be used in the dispenser. For example, glass capillary tubes (Eppendorf™ Femtotips™ II Microinjection Capillary Tips), having an inner diameter at the tip of 0.5 µm and an outer diameter at the tip of 0.7 µm, are available from Fisher Scientific. An exemplary, commercially available glass capillary tube 120 is shown schematically in FIG. 3. The glass capillary tube has an inlet 124 at a first end, and outlet 132 at a second end opposite the first end, and an elongate fluid passageway between the inlet 124 and outlet 132. A plastic handle 122 is attached to the glass capillary tube 120 around its circumference. The plastic handle 122 includes an inlet (input end) 124 and a threaded portion 126 near the inlet 124 which enables a threaded connection to an external body or external conduit (see FIG. 9). The inlet 124 has an inner diameter of 1.2 mm.

Figures 4, 5:
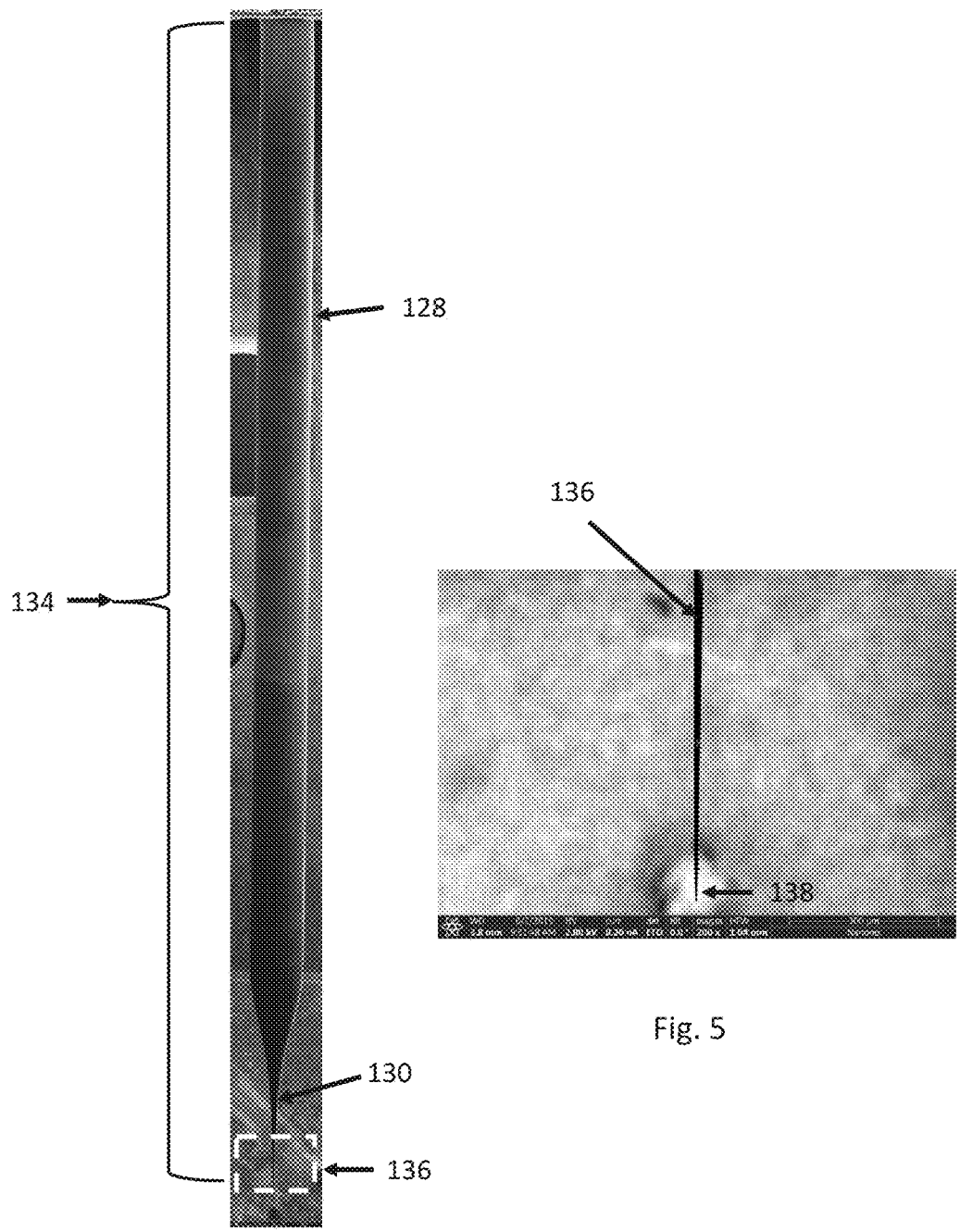
FIG. 4 is a scanning electron microscope (SEM) view of a portion of a glass capillary tube, according to one aspect of this disclosure.
FIG. 5 is a scanning electron microscope (SEM) view of a tapering portion of the glass capillary tube, under low magnification, according to one aspect of this disclosure.
Figure 6:
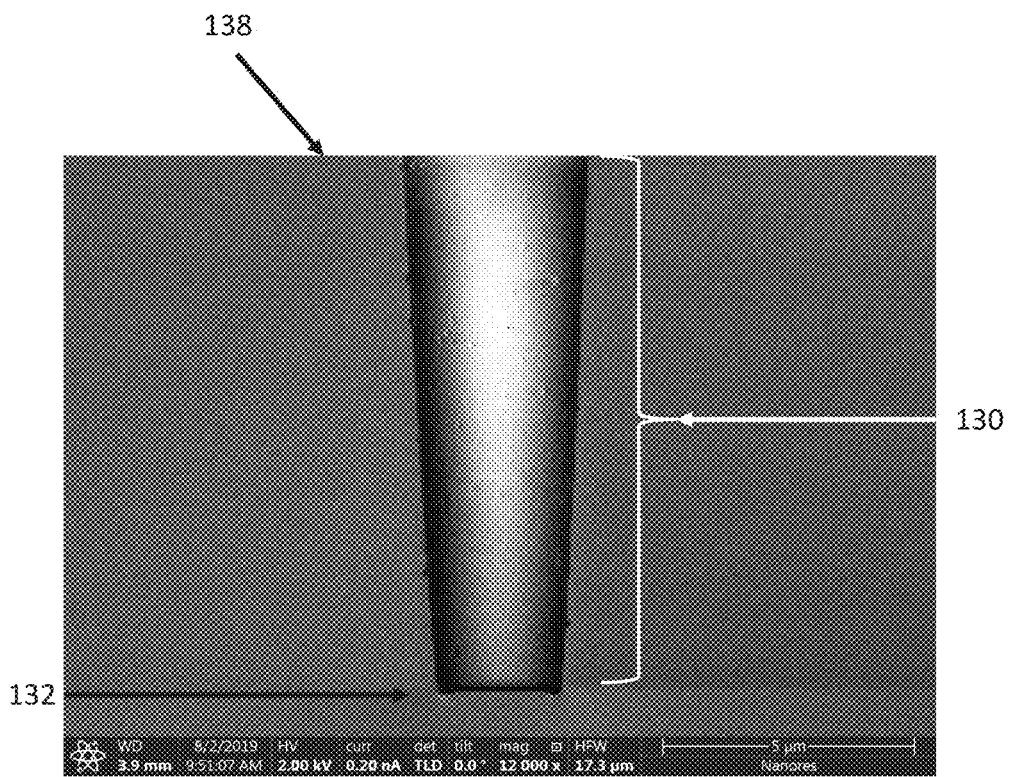
FIG. 6 is a scanning electron microscope (SEM) view of a tapering portion of the glass capillary tube, under high magnification, according to one aspect of this disclosure.

The glass capillary tube 120 includes an elongate input portion 128 and a tapering portion 130. There is an externally visible portion 134 of the glass capillary tube 120. Some of the elongate input portion 128 may be obscured by the surrounding plastic handle 122. The tapering portion 130 tapers to an outlet (output end) 132 (having an inner diameter of 0.5 µm and an outer diameter at the tip of 0.7 µm in the case of the certain Femtotips™ II Microinjection Capillary Tips). Stainless-steel capillary tubes can also be used. The reduction of diameter along the tapering portion 130 from the elongate input portion 128 to the outlet 132 is more clearly illustrated in FIGS. 4 through 6. FIG. 4 is a scanning electron micrograph view (formed from stitching together multiple SEM images) of the entire externally visible portion 134 of the glass capillary tube 120. A first magnification region 136 of the tapering portion 130 including the outlet 132, observed under low magnification in a scanning electron microscope (SEM), is shown in FIG. 5. Furthermore, a second magnification region 138 located within the first magnification region 136, observed under high magnification in a scanning electron microscope (SEM), is shown in FIG. 6.

The outer diameter is smallest at the outlet 132 (FIG. 6) and increases with increasing longitudinal distance from the outlet 132.

Figure 7:
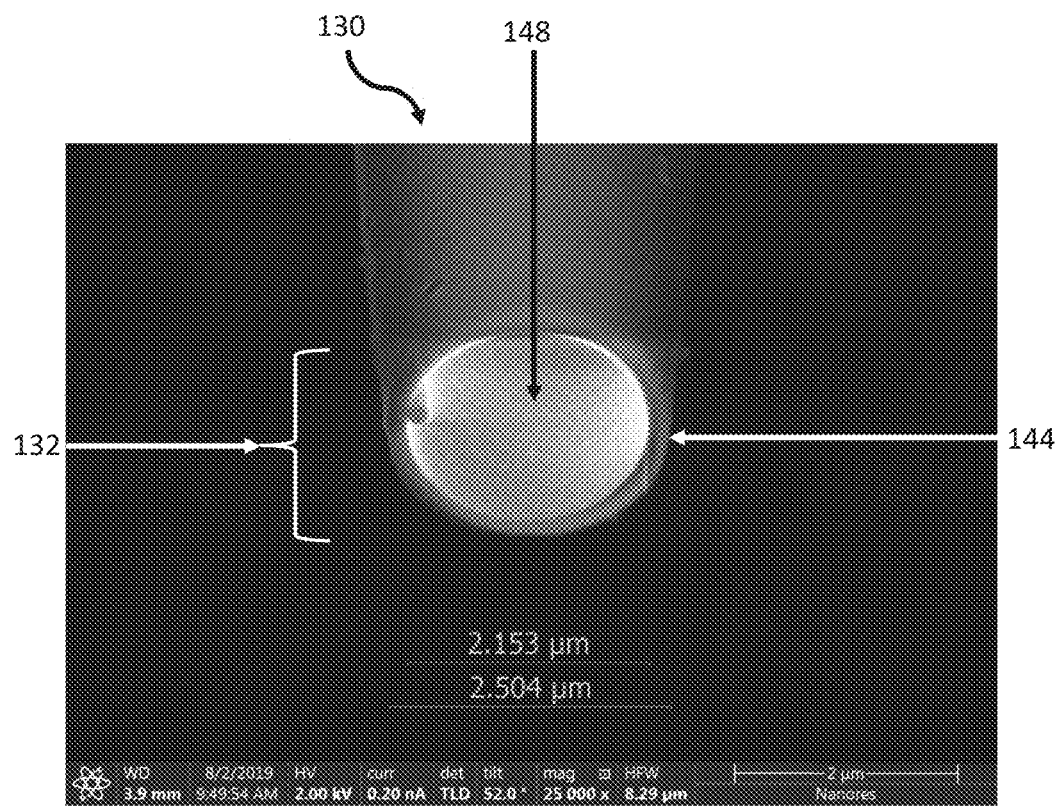
FIG. 7 is a scanning electron microscope (SEM) view of the output portion after focused-ion beam treatment, under high magnification, according to one aspect of this disclosure.

In many cases it is desirable to increase the size of the outlet 132 (outlet size). It is possible to increase the outlet size by cutting the glass capillary tube 120 at a suitable longitudinal location along the tapering portion 130. Cutting may be done using a focused-ion beam (FIB) apparatus. For example, a plasma-source Xe+ FIB (also called PFIB) is used. The capillary tube is installed in the FIB apparatus. A longitudinal location along the tapering portion 130 is selected, and the focused ion beam is directed to it, with sufficient energy density for cutting the glass tube. A cut is made using the focused-ion beam across the tapering portion at the selected longitudinal location. A scanning electron microscope (in the FIB apparatus) is used to measure the outer diameter or inner diameter or both at the tip. If the measured inner diameter or outer diameter or both are too small, the cutting is carried out at another longitudinal location along the tapering portion. In the example shown in FIG. 7, the outlet inner diameter is measured to be 2.153 µm and the outlet outer diameter is measured to be 2.504 µm. We refer to the outlet outer diameter as the outlet size. For glass capillary tubes 120, outlet sizes in a range of 0.7 µm to 8 µm are possible and have been tried.

At step 14, the metallic nanoparticle composition is injected into the cylinder 150. In the case of the piston-cylinder assembly shown in FIG. 8, this can be accomplished by injecting the metallic nanoparticle composition into the cylinder 150 via its first end 164 using a syringe, with the piston 158 removed from the cylinder and the cover 170 and the pneumatic connector 180 detached from the cylinder 150. Subsequently, the piston is positioned in the cylinder. Additionally, in the example shown in FIG. 8, the cylinder cover 170 and the pneumatic connector 180 are attached to the cylinder 150 at step 14. The pneumatic port 184 is coupled to a regulated pneumatic system 106 via tubing 107.

Figure 10:
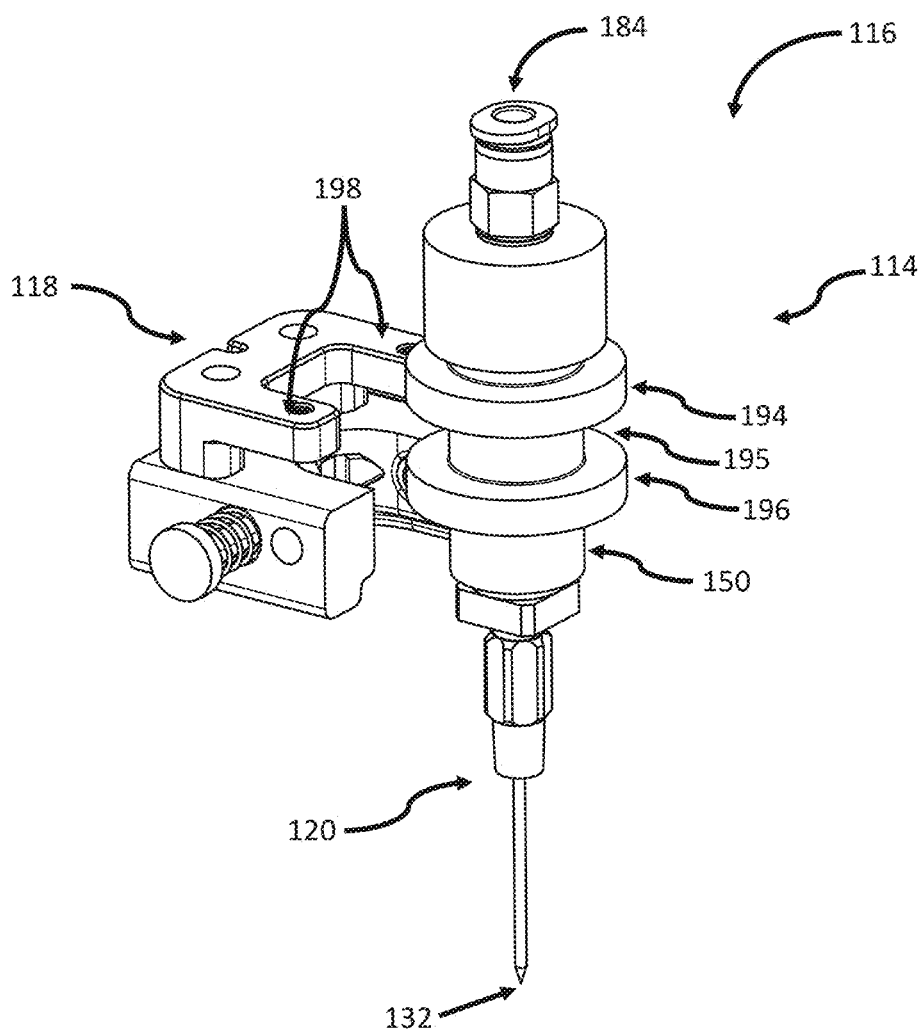
FIG. 10 is a schematic perspective view of a metallic nanoparticle composition dispenser and an associated dispenser holder, according to one aspect of this disclosure.

FIG. 10 is a schematic perspective view of a metallic nanoparticle composition dispenser 116 and an associated dispenser holder 118. The dispenser holder 118 includes a fork 198. When assembled, the fork is inserted into a groove 195 between two annular protrusions 194, 196 that protrude radially outward from the outer walls of the cylinder 150. Accordingly, the dispenser holder 118 retains the dispenser. The dispenser holder 118 is mechanically coupled to the print head positioning system 108. At step 14, the dispenser 116 is installed in the dispenser holder 118.

As shown in FIG. 2, the imaging system 109 captures images of the capillary tube outlet 132 and a portion of the substrate's printable surface 112 near the capillary tube outlet 132. The imaging system 109 is used to monitor a vertical distance (height) between the capillary tube outlet 132 and a surface on which the metallic nanoparticle composition is dispensed, such as the printable surface 112 of the substrate 110. The print head positioning system 108 is configured to vertically position and laterally position the print head (e.g., the outlet of the capillary tube) relative to the substrate. The print head positioning system 108 controls the vertical displacement of the print head 104 and the lateral displacement of the print head 104 relative to the substrate.

According to method 10, a metallic nanoparticle composition dispenser 116 including a piston-cylinder assembly is preferably used to dispense the metallic nanoparticle composition. According to this method, regulated pressure is applied to a piston in the piston-cylinder assembly, and the piston extrudes the metallic nanoparticle composition. The extrusion relies solely on the applied pressure; the dispensing (extruding) is carried out without the application of electric fields to the nanoparticle composition. As the metallic nanoparticle composition is highly viscous, the composition is extruded to a filament and no liquid droplets are formed. In a case that a filament is quite short, a dot-like feature can be formed.

The print head positioning system 108 controls the vertical displacement of the capillary tube 120 and the lateral displacement of the capillary tube 120 relative to the substrate 110. During dispensing of the metallic nanoparticle composition onto the substrate, the print head 104 is moved laterally and/or vertically. In the example shown in FIG. 2, the capillary tube is tilted during the dispensing of the metallic nanoparticle composition onto the substrate, such that the dispenser 116 travels ahead of the capillary tube outlet during the lateral displacement. In other examples, the capillary tube is held at a vertical orientation during the dispensing of the metallic nanoparticle composition onto the substrate. During dispensing, the print head positioning system 108 preferably maintains a vertical distance between the nozzle outlet and the surface (the surface on which the composition is being dispensed) in a range of approximately 1 μm and 10 μm. For larger nozzle outlet sizes and suitably adjusted process parameters (e.g., more dispensed material), vertical distances (heights) of greater than 10 μm are possible. It is also possible to dispense the composition at heights of less than 1 μm including direct contact of the nozzle outlet to the substrate (1 μm).

Figure 11:
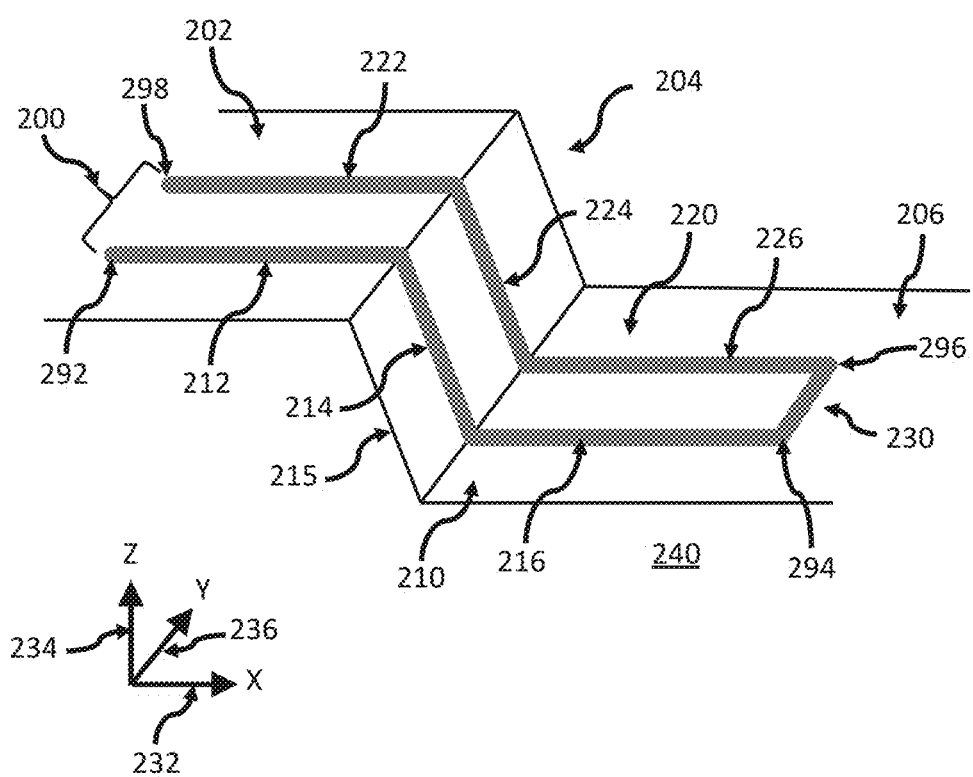
FIG. 11 is a schematic perspective view of a feature that traverses a microscopic step on or in a substrate, according to one aspect of this disclosure.

Suppose that one wishes to form an electrically conductive feature 200 as shown in schematic perspective view in FIG. 11. There is a microscopic step 204 on or in a substrate 240. There is a step top portion 202 and a step bottom portion 206 associated with the microscopic step 204. For example, the microscopic step 204 can be in the substrate 240 if the step bottom portion 206 has been formed by etching into the substrate 240. As another example, microscopic step 204 can be on the substrate 240 if the step top portion 202 has been formed by depositing and or patterning material on the substrate 240. As yet another example, microscopic step 204 can be on the substrate 240 if a component (e.g., a light emitting diode chip) is mounted on the substrate and an electrical connection (electrically conductive feature) is to be formed on a top surface of the component. One might consider extruding a metallic nanoparticle composition while moving (displacing) the capillary tube 120 (the print head 104) from a first end point 292 (on the step top portion 202) to a first vertex 294 (on the step bottom portion 206), from the first vertex 294 to a second vertex 296 (also on the step bottom portion 206), and from the second vertex 296 to a second end point 298 (on the step top portion 202). However, we have found it to be beneficial to consider the electrically conductive feature 200 as consisting of the following: (1) a feature 210, extending between the first end point 292 and the first vertex 294; (2) a feature 220, extending between the second end point 298 and the second vertex 296; and (3) a feature 230, extending between the first vertex 294 and the second vertex 296. Features 210 and 220 traverse the microscopic step 204. Feature 230 does not traverse the microscopic step 204. Feature 210 is continuous and includes: feature portion 212 on the step top portion 202, feature portion 214 on a sidewall 215 of the microscopic step 204, and feature portion 216 on the step bottom portion 206. Feature 220 is continuous and includes: feature portion 222 on the step top portion 202, feature portion 224 on a sidewall 215 of the microscopic step 204, and feature portion 226 on the step bottom portion 206. A feature that traverses a microscopic step can be formed more reliably (without discontinuities) and more quickly by following trajectory that begins at the step top portion and ends at step bottom portion. Accordingly, at step 16, a trajectory of a capillary tube traversing the microscopic step from a step top portion to a step bottom portion is planned.

In the foregoing paragraph, we referred to the capillary tube being at certain points on the step top portion 202 or the step bottom portion 206. The capillary tube outlet 132 might or might not contact the step top portion 202 or the step bottom portion 206. For example, the capillary tube outlet 132 can be at a height in a range of 1 μm to 10 μm above the respective portion of the surface (e.g., step bottom portion 202 during step 20 and step top portion 206 during step 24) on which metallic nanoparticle composition is dispensed. Accordingly, a statement that capillary tube is at a certain point means that a lateral position of the capillary tube outlet 132 is at that point and a vertical position of the capillary tube outlet 132 is at or above that point.

Figure 12:
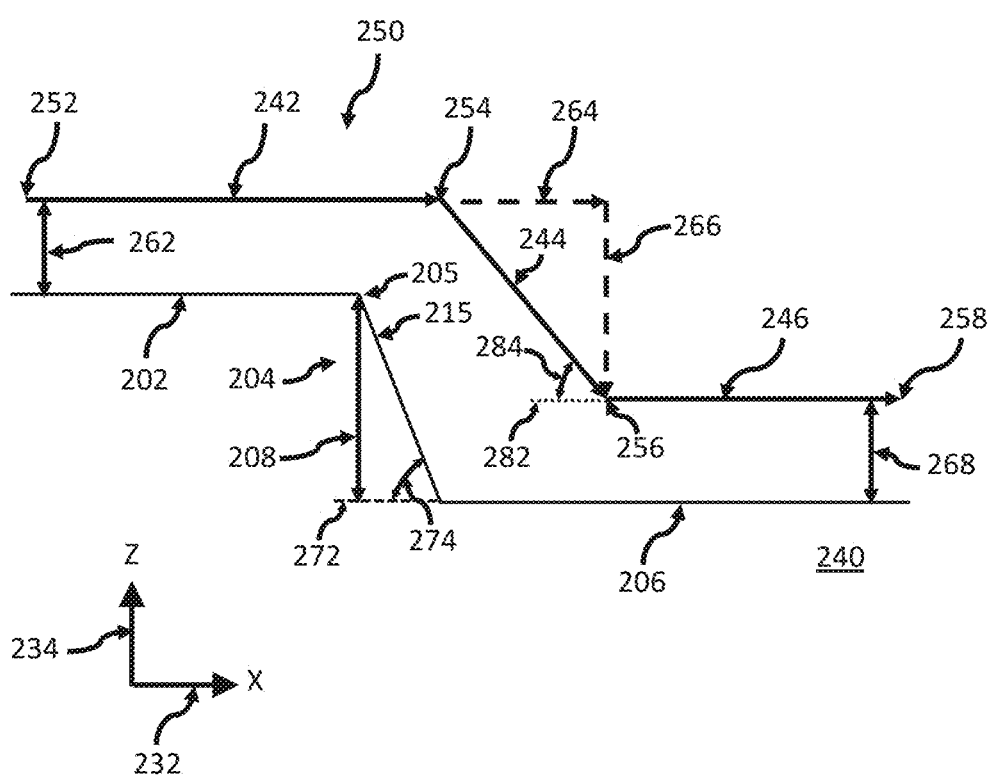
FIG. 12 is a schematic side view of a trajectory of a capillary tube in forming a feature, according to one aspect of this disclosure.

Steps 18, 20, 22, and 24 are explained with reference to FIG. 12. FIG. 12 is schematic side view of a trajectory 250 of an outlet of a capillary tube relative to the microscopic step 204 and the substrate 240. The microscopic step 204 has a height 208 above the step bottom portion 206. A sidewall 215 of the microscopic step 204 has a slope angle 274, defined as an angle between the sidewall 215 and a lateral reference line 272. The lateral reference line 272 is a reference line that is parallel to a major surface of the substrate 240 (e.g., parallel to X-direction 232). At step 16, trajectories including trajectory 250 are planned. At step 18, the capillary tube is moved to the first position (e.g., 252). The first position 252 is at a height 262 above the step top portion 202. For example, the height 262 can be in a range of 1 μm to 10 μm. At step 20, the metallic nanoparticle composition is extruded from a capillary tube while the capillary tube is displaced relative to the substrate 240 along a first portion 242 of the trajectory 250 from a first position 252 past an edge 205 of the microscopic step 204 to a second position 254 to form a first extrudate. For example, second position 254 can be in a range of 1 to 10 μm past the edge 205, along the X-direction 232. This displacing is predominantly lateral. In the example shown, the displacing is along the X-direction 232, parallel to a major surface of the substrate 240. The first extrudate is continuous and overlies and contacts the step top portion 202. A portion of the first extrudate might also contact a sidewall 215 of the microscopic step 204. Preferably, the displacing of the capillary tube relative to the substrate along the first portion of the trajectory is at a first steady-state speed v1 in a range of 0.001 to 1 mm/sec.

At step 22, the metallic nanoparticle composition is extruded from a capillary tube while the capillary tube is displaced relative to the substrate 240 along a second portion 244 of the trajectory 250 from the second position 254 to a third position 256 to form a second extrudate. The second trajectory portion 244 is sloped. A slope angle 284 of the second trajectory portion 244 is defined as an angle between the second trajectory portion 244 and a lateral reference line 282. The lateral reference line 282 is a reference line that is parallel to a major surface of the substrate 240 (e.g., parallel to X-direction 232). The third position 256 is above the step bottom portion 206 and is at a lower height than the second position 254. The second extrudate is continuous and is connected to the first extrudate. Preferably, the second extrudate contacts a sidewall 215 of the microscopic step 204. Preferably, the displacing of the capillary tube relative to the substrate along the second portion of the trajectory is at a second steady-state speed v2 in a range of 0.001 to 1 mm/sec.

At step 24, the metallic nanoparticle composition is extruded from a capillary tube while the capillary tube is displaced relative to the substrate 240 along a third portion 246 of the trajectory 250 from a third position 256 to a fourth position 258 to form a third extrudate. The fourth position 258 is above the step bottom portion 206. The fourth position 258 is at a height 268 above the step bottom portion 206. For example, the height 268 can be in a range of 1 μm to 10 μm. This displacing is predominantly lateral. Herein, lateral can mean along the X-direction 232, along the Y direction 236, or within a plane defined by the X-direction 232 and the Y-direction 236. The plane defined by the X-direction 232 and the Y-direction 236 is approximately parallel to a major surface of the substrate 240. Herein, "predominantly lateral" can mean a direction that is within 10 degrees of a lateral direction, or preferably within 5 degrees of a lateral direction. In the example shown, the displacing is predominantly along the X-direction 232, parallel to the major surface of the substrate 240. The third extrudate is continuous and is connected to the second extrudate. Preferably, the displacing of the capillary tube relative to the substrate along the third portion of the trajectory is at a third steady-state speed v3 in a range of 0.001 to 1 mm/sec. Steps 18, 20, 22, and 24 are repeated if not all of the features that traverse the microscopic step(s) have been completed (NO branch at decision step 26).

Steps 18, 20, 22, 24, and 26 are repeated if there are other stepped features (features traversing a microscopic step) to be formed (NO branch at decision step 26). If all of the features that traverse microscopic steps have been completed (YES branch at decision step 26), then step 28 can be carried out. Step 28 is an optional step to form features (or feature portions) that do not traverse the microscopic step(s). During step 28, the metallic nanoparticle composition is extruded while the capillary tube is displaced relative to the substrate along a portion of the trajectory that does not traverse a microscopic step. In FIG. 1, step 28 is shown as being carried out after steps 18, 20, 22, 24, and 26. Alternatively, step 28 can be carried out: (1) after step 16 and before steps 18, 20, 22, 24, and 26, or (2) in between successive iterations of steps 18, 20, 22, 24, and 26.

At step 30, the workpiece is sintered. The workpiece includes the substrate, the conductive feature, and any other existing features on the substrate. The workpiece can be sintered in an atmosphere of air or in a protective atmosphere. Examples of protective atmospheres are: Argon, Nitrogen, and a mixture of Hydrogen (5 vol. %) and Nitrogen (95 vol. %). The workpiece can be sintered at a temperature in a range of 150° C. to 250° C. Photonic sintering can also be used. Photonic sintering can be carried out using a laser or a flash lamp. If a laser is used, emission wavelengths of 1064 nm, 532 nm, and 450 nm have been effective. The laser can be operated in continuous-wave mode or pulsed mode.

In the example shown in FIG. 11, steps 18, 20, 22, and 24 can be carried out to form each of the electrically conductive features 210, 220. Each respective electrically conductive feature 210, 220 includes a first extrudate, a second extrudate, and a third extrudate. At step 16, trajectories are planned for the capillary tube to traverse the microscopic step 204 from the step top portion 202 to the step bottom portion 206. Following are two examples of possible trajectories in the case of FIG. 11. Trajectory 1: trajectory portion 1a from point 292 to 294 (traversing microscopic step 204), trajectory portion 1b from point 298 to point 296 (traversing microscopic step 204), and portion 1c from point 294 to point 296 (on step bottom portion only). Trajectory 2: trajectory portion 2a from point 292 to point 296 via point 294 (traversing microscopic step 204) and trajectory portion 2b from point 298 to point 296 (traversing microscopic step 204). In Trajectory 2, the direction of lateral displacement of the capillary tube is along the X-direction 232 when printing segment 216 and then the direction changes to the Y-direction 236 when printing segment 230. At step 16, either Trajectory 1 or Trajectory 2 can be planned.

Suppose that Trajectory 1 is planned at step 16. In a first iteration of steps 18, 20, 22, 24, and 26, feature 210 (212, 214, 216) is formed. In a second iteration of steps 18, 20, 22, 24, and 26, feature 220 (222, 224, 226) is formed. At step 28, feature 230 is formed. Alternatively, if Trajectory 2 is planned at step 16, optional step 28 can be skipped because there is no trajectory portion that does not traverse a microscopic step.

Figure 13:
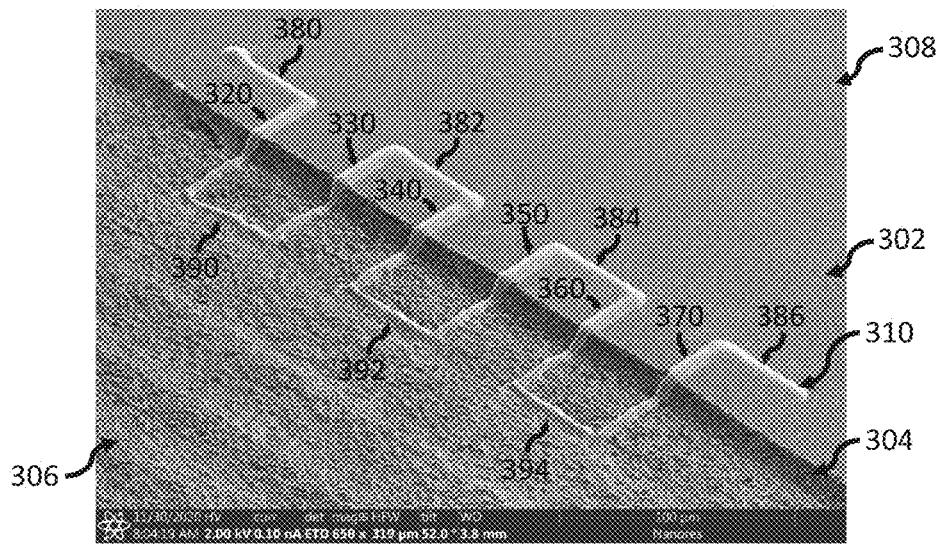
FIGS. 13 and 14 are scanning electron microscope (SEM) views of an electrically conductive feature traversing a microscopic step in a substrate, according to one aspect of this disclosure.

FIG. 13 is a scanning electron microscope (SEM) perspective view of an electrically conductive feature 310 traversing a microscopic step 304 in a glass substrate 308. Feature 310 was formed using the Example 1 composition, which is a silver nanoparticle composition. This feature 310 traverses the microscopic step 304 six times. The step-bottom portion 306 was formed by etching into the glass substrate 360. As a result, the step bottom portion 306 has a significantly higher surface roughness than the step top portion 302. Nevertheless, the electrically conductive feature 310 is continuous. A height of the microscopic step 304 is approximately 10 µm. In other examples, a height of a microscopic step can be more than 10 µm, or more than 20 µm, or more than 30 µm.

The electrically conductive feature 310 includes feature segments (features) that traverse the microscopic step 304 (320, 330, 340, 350, 360, and 370), feature segments that are on the step top portion only (380, 382, 384, and 386), and feature segments that are on the step bottom portion only (390, 392, and 394). At step 16, the capillary tube trajectory is planned such that all of the features segments that traverse the microscopic step 304 are formed from the step top portion 302 to the step bottom portion 306. Line widths of portions of the electrically conductive feature 310 on the step top portion (302) (smoother surface) are 7 µm±0.2 µm. Line widths of portions of the electrically conductive feature 310 on the step bottom portion (306) (rougher surface) are 5 µm±0.2 µm. Typically, line widths in a range of approximately 5 µm to 20 µm are possible. A glass capillary tube having an outlet size of approximately 5 µm was used. In the case of the feature segments that traverse the microscopic step 304, the steady-state speed of displacement of the capillary tube relative to the substrate, for all trajectory portions was 0.01 mm/sec (v1, v2, and v3).

Figure 14:
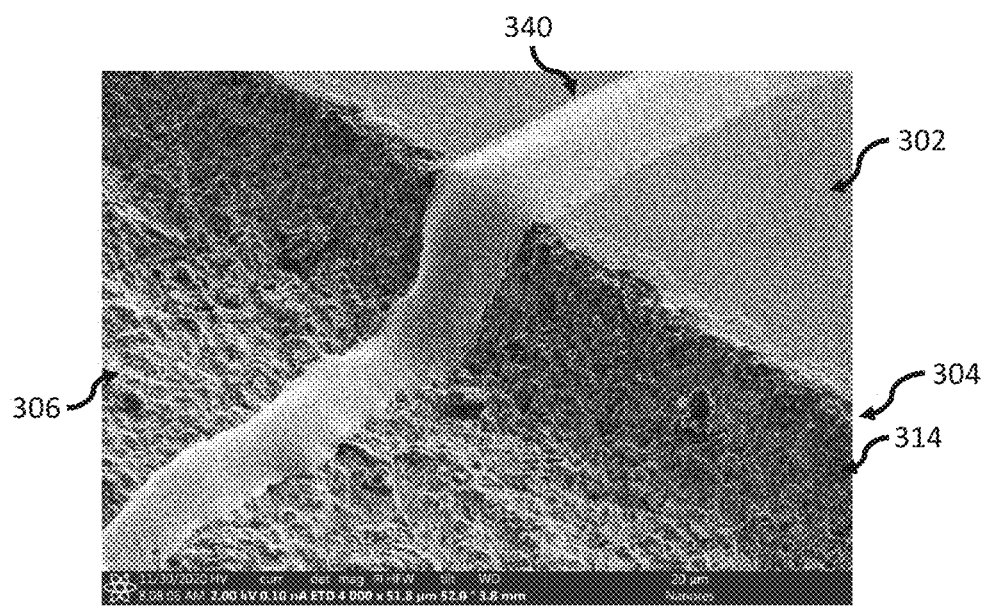

A portion of a feature segment 340 traversing a microscopic step 304 is shown under greater magnification in FIG. 14. A height of the microscopic step 304 is approximately 10 µm. In other examples, a height of a microscopic step can be more than 10 µm, or more than 20 µm, or more than 30 µm. The feature segment 340 contacts the step top portion 302, the sidewall 314, and the step bottom portion 306. A sidewall 314 of the microscopic step 304 has a slope angle (274 in FIG. 12) ranging between approximately 70 degrees and 80 degrees. In the example shown, a slope angle (284 in FIG. 12) of the second trajectory portion (sloped trajectory portion) 244 was selected to be approximately 45 degrees. Preferably, the capillary tube 120 should not contact the sidewall 215. By selecting the slope angle of the second trajectory portion 244 to be less than the slope angle of the sidewall, a likelihood that the capillary tube 120 will contact the sidewall 215 is reduced. Preferably, a slope angle of the second portion of the trajectory is 60 degrees or less.

In the example shown in FIGS. 13 and 14, the surface roughness of the step bottom portion 306 is much greater than that of the sidewall 314 and of the step top portion 302. The surface roughness of the sidewall 314 is greater than that of the step top portion 302. We have found that in order to achieve comparable line widths, more material is needed on a surface with higher surface roughness than a surface with lower surface roughness. The amount of extruded material can be adjusted by adjusting the applied pressure under which the material is extruded. Accordingly, the extruding of the metallic nanoparticle composition during the first trajectory portion 242 is carried out under a first applied pressure P1, the extruding of the metallic nanoparticle composition during the second trajectory portion 244 is carried out under a second applied pressure P2, and the extruding of the metallic nanoparticle composition during the third trajectory portion 246 is carried out under a third applied pressure P3.

Preferably, each of these applied pressures P1, P2, and P3, measured at the regulated pressure system 106, is in a range of 0 bar to 9 bar. Preferably, the first applied pressure P1 is selected in accordance with a surface roughness of a respective portion of the substrate underlying the first trajectory portion 242. Preferably, the second applied pressure P2 is selected in accordance with a surface roughness of a respective portion of the substrate underlying the second trajectory portion 244. Preferably, the third applied pressure P3 is selected in accordance with a surface roughness of a respective portion of the substrate underlying the third trajectory portion 246. In the case of electrically conductive feature 310 (FIG. 13), an applied pressure of 5.5 bar was selected for trajectory portions corresponding to feature segments on the step top portion only (380, 382, 384, 386), an applied pressure P1, P2 of 6.0 bar was selected for first and second trajectory portions of each of the feature segments traversing the microscopic step (320, 330, 340, 340, 360, 370), an applied pressure P3 of 7.0 bar was selected for third trajectory portions of each of the feature segments traversing the microscopic step (320, 330, 340, 340, 360, 370), and an applied pressure of 7.0 bar was selected for trajectory portions corresponding to feature segments on the step bottom portion only (390, 392, 394). The selection of these applied pressures is consistent with an observation, from the SEM images of FIGS. 13 and 14, that the step bottom portion 306 has much greater surface roughness than the step sidewall 314 and the step top portion 302.

Printing apparatus 100 preferably includes a controller 119 (FIG. 1). For example, controller 119 includes a computer with the hardware and software necessary for communicating with and controlling the imaging system 109, the print head positioning system 108, and the pneumatic system 106. Preferably, the controller determines, using image data from the imaging system 109, a current vertical distance between the nozzle outlet and the surface (the surface on which the composition is being dispensed). In accordance with the current vertical distance, the controller 119 controls the print head positioning system 108 to maintain a vertical distance within a desired range. Preferably, the planning of the trajectories (step 16) is carried out by the controller in accordance with a predetermined layout of electrically conductive feature(s) on the substrate.

The controller 119 is configured to concurrently control the print head positioning system and the regulated pneumatic system such that a metallic nanoparticle composition is extruded by the piston through the capillary tube under a pressure applied by the regulated pneumatic system. When the planning of the trajectories is carried out (step 16), the controller can also plan the pressures to be applied by the regulated pneumatic system during each portion of the trajectories. Preferably, the pressure is varied in accordance with a surface roughness of a respective portion of the substrate underlying the capillary tube.

EXAMPLES

Example 1: Silver Nanoparticle Paste Composition (85 wt %) in Triethylene Glycol, Including Dispersing Agent 2 wt Reagents:
AgNO3—12.5 g
PVP (K30 grade)—100.1 g
Ethylene glycol—560 ml
Acetone—1520 ml
Ethanol 96%—300 ml
Triethylene glycol—1.326 ml
Dispersing agent, alkylammonium salt of a copolymer with acidic groups—235.2 µl 1) Synthesis Two synthesis reactions were done in parallel. For each synthesis reaction: AgNO3 (12.5 g) was dissolved in 50 ml of Ethylene Glycol at room temperature. In a three-necked flask, PVP (100.2 g) was dissolved in 250 ml of Ethylene Glycol, under reflux, while heating at 140° C. AgNO3 solution was poured in a quick movement (via funnel) into hot PVP dissolved in Ethylene Glycol. Mixtures were heated at 140° C. for 60 min under vigorous stirring. Finally, cooled in cold water bath until room temperature was reached.

2) Purification

Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag NPs suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet were individually re-dispersed in premixtures of 30 ml EtOH and 58.8 µl dispersing agent (for each of 4 bottles of the double synthesis) under sonication and shaking (10 min).

3) Formulation

Approximately 120 ml of obtained dispersion were transferred into a syringe and filtered through 1.0 µm PA filter directly into round-bottom flask. 1.326 ml of triethylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 µm PVDF filter directly into 5 ml PE syringe (filled from top). Obtained dispersion is estimated to have a solid content concentration of 85 wt %±2 wt % (based on TGA measurement). Silver content is estimated to be in a range of 79 wt % to 83 wt % (based on ICP or AAS measurement). The concentration of the dispersing agent in the composition is estimated to be approximately 2 wt %.

Various aspects of the devices, systems, and methods described herein are set out in the following clauses.

Clause 1: A method of forming an electrically conductive feature traversing a microscopic step on or in a substrate, the method comprising the steps of: (A) continuously extruding a metallic nanoparticle composition from a capillary tube while displacing the capillary tube relative to the substrate along a first portion of a trajectory from a first position past an edge of the microscopic step to a second position to form a first extrudate, the first position being above a step top portion, the displacing being predominantly lateral, the first extrudate overlying and contacting the step top portion, the first extrudate being continuous; (B) continuously extruding the metallic nanoparticle composition from the capillary tube while displacing the capillary tube relative to the substrate along a second portion of the trajectory from the second position to a third position to form a second extrudate, the second portion of the trajectory being sloped, the third position being above a step bottom portion and being at a lower height than the second position, the second extrudate being continuous and being connected to the first extrudate; and (C) continuously extruding the metallic nanoparticle composition from the capillary tube while displacing the capillary tube relative to the substrate along a third portion of the trajectory from the third position to a fourth position to form a third extrudate, the fourth position being above the step bottom portion, the displacing being predominantly lateral, the third extrudate overlying and contacting the step bottom portion, the third extrudate being continuous and being connected to the second extrudate; wherein the electrically conductive feature comprises the first extrudate, the second extrudate, and the third extrudate.

Clause 2: The method of clause 1, additionally comprising the step of: planning the trajectory of the capillary tube traversing the microscopic step from the step top portion to the step bottom portion.

Clause 3: The method of any of clauses 1-2, wherein the displacing of the capillary tube relative to the substrate along the first portion of the trajectory is at a first steady-state speed v1 in a range of 0.001 to 1 mm/sec.

Clause 4: The method of any of clauses 1-3, wherein the displacing of the capillary tube relative to the substrate along the second portion of the trajectory is at a second steady-state speed v2 in a range of 0.001 to 1 mm/sec.

Clause 5: The method of any of clauses 1-4, wherein the displacing of the capillary tube relative to the substrate along the third portion of the trajectory is at a third steady-state speed v3 in a range of 0.001 to 1 mm/sec.

Clause 6: The method of any of clauses 1-5, wherein a slope angle of the second portion of the trajectory is 60 degrees or less.

Clause 7: The method of any of clauses 1-6, wherein a height of the microscopic step is at least 10 µm.

Clause 8: The method of claim any of clauses 1-7, wherein the extruding of the metallic nanoparticle composition at step (A) is carried out under a first applied pressure P1, the extruding of the metallic nanoparticle composition at step (B) is carried out under a second applied pressure P2, and the extruding of the metallic nanoparticle composition at step (C) is carried out under a third applied pressure P3, each one of the first applied pressure P1, the second applied pressure P2, and the third applied pressure P3 being in a range of 0 bar to 9 bar.

Clause 9: The method of any of clauses 1-8, wherein the first applied pressure P1 is selected in accordance with a surface roughness of a respective portion of the substrate underlying the first portion of the trajectory.

Clause 10: The method of any of clauses 1-9, wherein the second applied pressure P2 is selected in accordance with a surface roughness of a respective portion of the substrate underlying the second portion of the trajectory.

Clause 11: The method of any of clauses 1-10, wherein the third applied pressure P3 is selected in accordance with a surface roughness of a respective portion of the substrate underlying the third portion of the trajectory.

Clause 12: The method of any of clauses 1-11, wherein the metallic nanoparticle composition comprises metallic nanoparticles at a concentration of 75 wt % or greater.

Clause 13: The method of any of clauses 1-12, wherein the metallic nanoparticle composition comprises silver nanoparticles.

Clause 14: The method of any of clauses 1-13, wherein the metallic nanoparticle composition comprises: triethylene glycol, and a concentration, in aggregate, of solvents having a boiling point of less than 280° C. at a pressure of 760 mm Hg in the metallic nanoparticle composition that does not exceed 3 wt %.

Clause 15: The method of any of clauses 1-14, wherein an outlet of the capillary tube has an outer diameter in a range of 0.7 µm to 8 µm.

Clause 16: The method of any of clauses 1-15, wherein the capillary tube is a glass capillary tube.

Clause 17: An apparatus for forming an electrically conductive feature traversing a microscopic step on or in a substrate, the apparatus comprising: a substrate stage which supports the substrate; a print head; a regulated pneumatic system; a print head positioning system configured to vertically position and laterally position the print head relative to the substrate; and a controller electronically coupled to the print head positioning system and to the regulated pneumatic system; wherein the print head comprises (1) a piston-cylinder assembly comprising a cylinder, a pneumatic port at a first end of the cylinder, an outlet port at a second end of the cylinder opposite the first end, and a piston movable in the cylinder between the first end and the second end, the pneumatic port being pneumatically coupled to the regulated pneumatic system and (2) a capillary tube comprising a tube inlet and a tube outlet, the tube inlet being coupled to the outlet port; and wherein the controller is configured to concurrently control the print head positioning system and the regulated pneumatic system such that a metallic nanoparticle composition is extruded by the piston through the capillary tube under a pressure applied by the regulated pneumatic system while the capillary tube is displaced relative to the substrate, the pressure being varied in accordance with a surface roughness of a respective portion of the substrate underlying the capillary tube.

Clause 18: The apparatus of clause 17, wherein the pressure is in a range of 0 bar to 9 bar.

Clause 19: The apparatus of any of clauses 17-18, wherein the tube outlet has an outer diameter in a range of 0.7 µm to 8 µm; and wherein the capillary tube is a glass capillary tube.

Clause 20: The apparatus of any of clauses 17-18, wherein the displacing of the capillary tube relative to the substrate is at a steady-state speed in a range of 0.001 to 1 mm/sec.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures or characteristics may be combined in any suitable manner in one or more aspects.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system that "comprises," "has," "includes" or "contains"

one or more elements possesses those one or more elements, but is not limited to possessing only those one or more elements. Likewise, an element of a system, device, or apparatus that "comprises," "has," "includes" or "contains" one or more features possesses those one or more features, but is not limited to possessing only those one or more features.

The term "substantially", "about", or "approximately" as used in the present disclosure, unless otherwise specified, means an acceptable error for a particular value as determined by one of ordinary skill in the art, which depends in part on how the value is measured or determined. In certain embodiments, the term "substantially", "about", or "approximately" means within 1, 2, 3, or 4 standard deviations. In certain embodiments, the term "substantially", "about", or "approximately" means within 50%, 20%, 15%, 10%, 9%, 8%, 7%, 6%, 5%, 4%, 3%, 2%, 1%, 0.5%, or 0.05% of a given value or range.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

What is claimed is:

1. A method of forming an electrically conductive feature traversing a microscopic step on or in a substrate, the method comprising the steps of:
   (A) continuously extruding a metallic nanoparticle composition from a capillary tube while displacing the capillary tube relative to the substrate along a first portion of a trajectory from a first position past an edge of the microscopic step to a second position to form a first extrudate, the first position being above a step top portion, the displacing being predominantly lateral, the first extrudate overlying and contacting the step top portion, the first extrudate being continuous;
   (B) continuously extruding the metallic nanoparticle composition from the capillary tube while displacing the capillary tube relative to the substrate along a second portion of the trajectory from the second position to a third position to form a second extrudate, the second portion of the trajectory being sloped, the third position being above a step bottom portion and being at a lower height than the second position, the second extrudate being continuous and being connected to the first extrudate; and
   (C) continuously extruding the metallic nanoparticle composition from the capillary tube while displacing the capillary tube relative to the substrate along a third portion of the trajectory from the third position to a fourth position to form a third extrudate, the fourth position being above the step bottom portion, the displacing being predominantly lateral, the third extrudate overlying and contacting the step bottom portion, the third extrudate being continuous and being connected to the second extrudate;
   wherein the electrically conductive feature comprises the first extrudate, the second extrudate, and the third extrudate.

2. The method of claim 1, additionally comprising the step of:
   planning the trajectory of the capillary tube traversing the microscopic step from the step top portion to the step bottom portion.

3. The method of claim 1, wherein the displacing of the capillary tube relative to the substrate along the first portion of the trajectory is at a first steady-state speed v1 in a range of 0.001 to 1 mm/sec.

4. The method of claim 1, wherein the displacing of the capillary tube relative to the substrate along the second portion of the trajectory is at a second steady-state speed v2 in a range of 0.001 to 1 mm/sec.

5. The method of claim 1, wherein the displacing of the capillary tube relative to the substrate along the third portion of the trajectory is at a third steady-state speed v3 in a range of 0.001 to 1 mm/sec.

6. The method of claim 1, wherein a slope angle of the second portion of the trajectory is 60 degrees or less.

7. The method of claim 1, wherein a height of the microscopic step is at least 10 μm.

8. The method of claim 1, wherein the extruding of the metallic nanoparticle composition at step (A) is carried out under a first applied pressure P1, the extruding of the metallic nanoparticle composition at step (B) is carried out under a second applied pressure P2, and the extruding of the metallic nanoparticle composition at step (C) is carried out under a third applied pressure P3, each one of the first applied pressure P1, the second applied pressure P2, and the third applied pressure P3 being in a range of 0 bar to 9 bar.

9. The method of claim 8, wherein the first applied pressure P1 is selected in accordance with a surface roughness of a respective portion of the substrate underlying the first portion of the trajectory.

10. The method of claim 8, wherein the second applied pressure P2 is selected in accordance with a surface roughness of a respective portion of the substrate underlying the second portion of the trajectory.

11. The method of claim 8, wherein the third applied pressure P3 is selected in accordance with a surface roughness of a respective portion of the substrate underlying the third portion of the trajectory.

12. The method of claim 1, wherein the metallic nanoparticle composition comprises metallic nanoparticles at a concentration of 75 wt % or greater.

13. The method of claim 1, wherein the metallic nanoparticle composition comprises silver nanoparticles.

14. The method of claim 1, wherein the metallic nanoparticle composition comprises:
   triethylene glycol, and
   a concentration, in aggregate, of solvents having a boiling point of less than 280° C. at a pressure of 760 mm Hg in the metallic nanoparticle composition that does not exceed 3 wt %.

15. The method of claim 1, wherein an outlet of the capillary tube has an outer diameter in a range of 0.7 μm to 8 μm.

16. The method of claim 1, wherein the capillary tube is a glass capillary tube.

17. An apparatus for forming an electrically conductive feature traversing a microscopic step on or in a substrate, the apparatus comprising:
   a substrate stage which supports the substrate;
   a print head;
   a regulated pneumatic system;

a print head positioning system configured to vertically position and laterally position the print head relative to the substrate; and a controller electronically coupled to the print head positioning system and to the regulated pneumatic system;

wherein the print head comprises (1) a piston-cylinder assembly comprising a cylinder, a pneumatic port at a first end of the cylinder, an outlet port at a second end of the cylinder opposite the first end, and a piston movable in the cylinder between the first end and the second end, the pneumatic port being pneumatically coupled to the regulated pneumatic system and (2) a capillary tube comprising a tube inlet and a tube outlet, the tube inlet being coupled to the outlet port; and wherein the controller is configured to concurrently control the print head positioning system and the regulated pneumatic system such that a metallic nanoparticle composition is extruded by the piston through the capillary tube under a pressure applied by the regulated pneumatic system while the capillary tube is displaced relative to the substrate, the pressure being varied in accordance with a surface roughness of a respective portion of the substrate underlying the capillary tube.

18. The apparatus of claim 17, wherein the pressure is in a range of 0 bar to 9 bar.

19. The apparatus of claim 17, wherein the tube outlet has an outer diameter in a range of 0.7 µm to 8 µm; and wherein the capillary tube is a glass capillary tube.

20. The apparatus of claim 17, wherein the displacing of the capillary tube relative to the substrate is at a steady-state speed in a range of 0.001 to 1 mm/sec.

* * * * *